(12) United States Patent
Horng et al.

(10) Patent No.: US 9,332,672 B2
(45) Date of Patent: May 3, 2016

(54) ELECTRONIC PRODUCT INCLUDING A HEAT DISSIPATING DEVICE

(71) Applicant: SUNONWEALTH ELECTRIC MACHINE INDUSTRY CO., LTD., Kaohsiung (TW)

(72) Inventors: Alex Horng, Kaohsiung (TW); Tso-Kuo Yin, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 181 days.

(21) Appl. No.: 14/284,553

(22) Filed: May 22, 2014

(65) Prior Publication Data

US 2014/0254095 A1    Sep. 11, 2014

Related U.S. Application Data

(62) Division of application No. 12/614,473, filed on Nov. 9, 2009, now abandoned.

(51) Int. Cl.
*H05K 7/20* (2006.01)
*G06F 1/28* (2006.01)
*H01L 23/427* (2006.01)
(Continued)

(52) U.S. Cl.
CPC .............. *H05K 7/20154* (2013.01); *G06F 1/28* (2013.01); *H01L 23/427* (2013.01); *H05K 7/20163* (2013.01); *F28D 15/0233* (2013.01); *F28D 2021/0029* (2013.01); *H01L 2924/0002* (2013.01)

(58) Field of Classification Search
CPC . G06F 1/181–1/182; H05K 7/20218–7/20391; H05K 7/20409–7/20418; H05K 7/20009–7/202; H01L 23/46–23/3677

USPC .............. 361/676–678, 679.46–679.54, 361/688–723; 156/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| 4,699,208 A | 10/1987 | Wolf et al. ............... 165/47 |
| 6,038,128 A | 3/2000 | Hood et al. ........... 361/679.41 |

(Continued)

FOREIGN PATENT DOCUMENTS

| CN | 2650210 Y | 10/2004 |
| JP | 2007174469 A | 7/2007 |

(Continued)

*Primary Examiner* — Anthony Haughton
*Assistant Examiner* — Razmeen Gafur
(74) *Attorney, Agent, or Firm* — Alan D. Kamrath; Kamrath IP Lawfirm, P.A.

(57) ABSTRACT

An electronic product including a heat dissipating device is disclosed. The electronic product includes a casing, a heat conducting board, at least one fan unit and a plurality of electronic elements. The casing includes a compartment. The heat conducting board divides the compartment into first and second chambers. The first chamber includes a plurality of openings. The fan unit(s) includes an air inlet aligned with an opening of the openings, as well as an air outlet aligned with another opening of the openings. The first chamber defines at least one air channel each being in the form of a single air channel including two ends respectively in communication with the opening and the other opening. In one embodiment, the at least one fan unit includes first and second fan units. In another embodiment, the at least one air channel includes first and second air channels in communication with each other.

7 Claims, 9 Drawing Sheets

(51) Int. Cl.
*H01L 23/473* (2006.01)
*F28D 15/02* (2006.01)
*F28D 21/00* (2006.01)

(56) References Cited

U.S. PATENT DOCUMENTS

| | | | |
|---|---|---|---|
| 6,288,895 B1 | 9/2001 | Bhatia | 361/679.47 |
| 6,313,990 B1 | 11/2001 | Cheon | 361/699 |
| 6,430,042 B1 | 8/2002 | Ohashi et al. | 361/679.49 |
| 6,643,129 B2 | 11/2003 | Fujiwara | 361/679.47 |
| 6,657,859 B1 | 12/2003 | Karr | 361/679.33 |
| 6,789,611 B1 | 9/2004 | Li | 165/104.29 |
| 6,856,037 B2 | 2/2005 | Yazawa et al. | 290/43 |
| 7,178,587 B2 | 2/2007 | Liu | |
| 7,403,392 B2* | 7/2008 | Attlesey | G06F 1/20 165/104.33 |
| 7,515,414 B2 | 4/2009 | Horng | 361/697 |
| 7,885,067 B2 | 2/2011 | Sakata | 361/695 |
| 8,016,927 B2 | 9/2011 | Tracy et al. | 96/420 |
| 2002/0053421 A1 | 5/2002 | Hisano et al. | 165/104.33 |
| 2007/0263355 A1 | 11/2007 | Yu et al. | 361/700 |
| 2008/0043442 A1* | 2/2008 | Strickland | H05K 7/20418 361/709 |
| 2008/0055850 A1* | 3/2008 | Carlson | G06F 1/20 361/695 |
| 2008/0130229 A1 | 6/2008 | Chen et al. | |
| 2008/0151501 A1* | 6/2008 | Takasou | H05K 7/20154 361/697 |
| 2008/0158816 A1 | 7/2008 | Hung | |
| 2008/0218980 A1* | 9/2008 | Tracewell | H05K 7/20672 361/713 |
| 2009/0009969 A1 | 1/2009 | Chu | 361/700 |
| 2009/0161312 A1* | 6/2009 | Spearing | H05K 7/20727 361/679.47 |
| 2009/0310301 A1* | 12/2009 | Nelson | H05K 7/20163 361/695 |
| 2010/0053896 A1* | 3/2010 | Chen | G03B 21/16 361/697 |
| 2010/0091251 A1* | 4/2010 | Fujibayashi | G03B 21/16 353/56 |
| 2010/0124022 A1* | 5/2010 | Causevic | G06F 1/20 361/702 |
| 2010/0296250 A1* | 11/2010 | Huang | H05K 7/20518 361/700 |
| 2011/0019160 A1* | 1/2011 | Kitano | G03B 21/16 353/57 |
| 2011/0051370 A1* | 3/2011 | Leutwein | H05K 7/20909 361/697 |
| 2011/0075362 A1* | 3/2011 | Tomioka | H05K 7/20172 361/696 |
| 2011/0116230 A1* | 5/2011 | Kwak | H01Q 1/02 361/692 |
| 2011/0141684 A1* | 6/2011 | Klarer | G06F 1/206 361/679.33 |
| 2011/0157560 A1* | 6/2011 | Hsiao | H04N 9/3144 353/58 |
| 2011/0194258 A1* | 8/2011 | Kodadek, III | F21V 29/02 361/720 |
| 2011/0222243 A1* | 9/2011 | Nagami | B23K 9/1006 361/697 |
| 2011/0228470 A1* | 9/2011 | Chang | G06F 1/20 361/679.47 |
| 2012/0250255 A1* | 10/2012 | Shigeno | H05K 7/20918 361/692 |
| 2012/0287571 A1* | 11/2012 | Santos | G06F 1/20 361/679.48 |
| 2012/0314365 A1* | 12/2012 | Matsumoto | H01L 23/36 361/690 |
| 2012/0314373 A1* | 12/2012 | Park | H05K 7/1434 361/715 |
| 2012/0327590 A1* | 12/2012 | Heydari | G06F 1/20 361/679.47 |

FOREIGN PATENT DOCUMENTS

| | | |
|---|---|---|
| JP | 2008015440 | 1/2008 |
| JP | 2008165699 A | 7/2008 |
| JP | 4093479 B2 | 8/2008 |
| JP | 4737639 B2 | 8/2011 |
| TW | M309314 | 4/2007 |

* cited by examiner

ELECTRONIC PRODUCT INCLUDING A HEAT DISSIPATING DEVICE

CROSS REFERENCE TO RELATED APPLICATIONS

This is a divisional application of U.S. patent application Ser. No. 12/614,473 filed on Nov. 9, 2009.

BACKGROUND OF THE INVENTION

1. Field of the Invention

The present invention relates to an electronic product including a heat dissipating device and, more particularly, to an electronic product including a heat dissipating device that can operate without adverse affect by moisture, dust, etc.

2. Description of the Related Art

Electronic elements, such as microprocessors, chips, etc., of most electronic products are generally concentrated and mounted in a casing. However, the temperature in a generally sealed inner chamber of the casing rises more rapidly as the functions and operating speed of the electronic elements upgrade. Heat dissipating devices, such as fans or heat sinks, are provided to dissipate heat to maintain normal operation of the electronic elements at an appropriate temperature and to prolong the service lives of the electronic elements.

Figure 1:
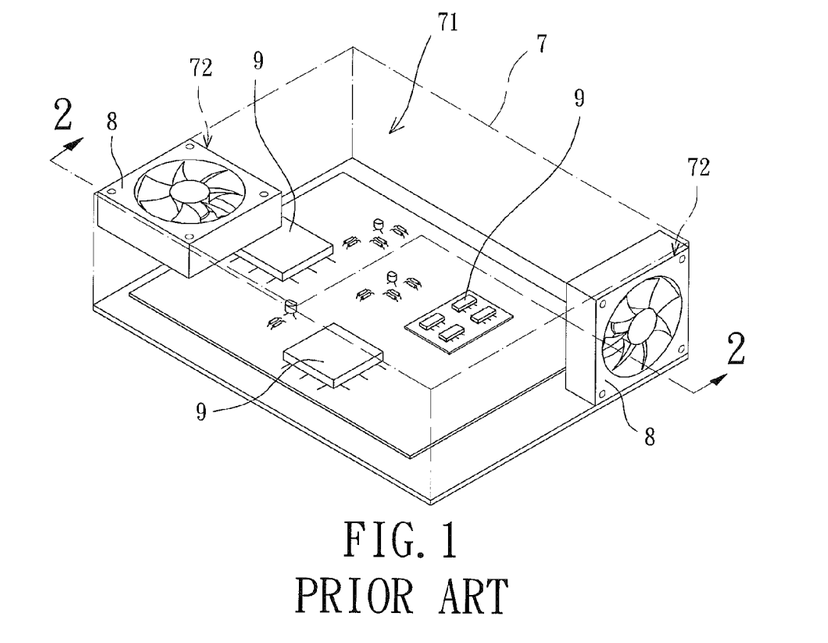
FIG. 1 shows a perspective view of a conventional heat dissipating device.
Figure 2:
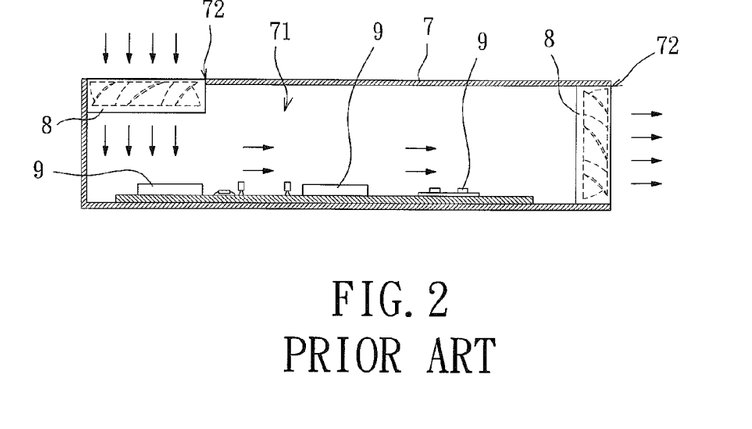
FIG. 2 shows a cross sectional view of the heat dissipating device of FIG. 1 according to section line 2-2 of FIG. 1.

FIGS. 1 and 2 show a conventional heat dissipating device including a casing 7 and two fan units 8. Specifically, the casing 7 includes a compartment 71 receiving a plurality of electronic elements 9. The casing 7 further includes two openings 72 respectively in a top side and one of four sides of the casing 7. Each fan unit 8 is mounted in one of the openings 72. The electronic elements 9 generate heat during operation, causing a rise in a temperature in the compartment 71. One of the fan units 8 draws ambient air at room temperature into the compartment 71 for heat exchange with the electronic elements 9. The other fan unit 8 expels the hot air after heat exchange out of the compartment 71, dissipating heat out of the compartment 71 and enhancing an overall heat dissipating effect in the casing 7. However, moisture, dust, etc. contained in the ambient air enters the compartment 71 together with the air, moistening the electronic elements 9 and causing short circuit or even damage to the electronic elements 9. The service life of the electronic product using the electronic elements 9 is, thus, shortened.

SUMMARY OF THE INVENTION

An objective of the present invention is to provide an electronic product including a heat dissipating device that can operate without adverse affect by moisture, dust, etc, prolonging the service lives of electronic elements.

Another objective of the present invention is to provide an electronic product including a heat dissipating device that transfers the heat generated by the electronic elements to a chamber for heat dissipation purposes.

A further objective of the present invention is to provide an electronic product including a heat dissipating device that provides a heat conducting board to increase a heat exchange area with the electronic elements for enhancing the overall heat dissipating efficiency.

The present invention fulfills the above objectives by providing, in a preferred form, an electronic product including a heat dissipating device. The electronic product comprises a casing, at least one heat conducting board, at least one fan unit and a plurality of electronic elements. The casing includes two opposing walls defining a compartment The at least one heat conducting board is mounted between the two opposing walls in the compartment and divides the compartment into a first chamber and a second chamber. The at least one heat conducting board is located between the first and second chambers. The first chamber includes a plurality of openings. The at least one heat conducting board is solid. The at least one fan unit is mounted in the first chamber. Each said at least one fan unit includes an air inlet and an air outlet. The air inlet is aligned and in communication with an opening of the plurality of openings. The air outlet is aligned and in communication with another opening of the plurality of openings. The plurality of electronic elements is located in the second chamber. At least one of the plurality of electronic elements is mounted upon the at least one heat conducting board. The first chamber and the second chamber are not in communication with each other. The first chamber defines at least one air channel. The at least one heat conducting board includes a plurality of fins located in the at least one air channel. The plurality of fins extends from the at least one heat conducting board towards but spaced from one of the two walls of the casing. The at least one air channel is in the form of a single air channel including first and second ends respectively in communication with the opening and the other opening of the plurality of openings. The at least one fan unit includes first and second fan units. The air inlet of the first fan unit is aligned and in communication with the opening of the plurality of openings. The air outlet of the second fan unit is aligned and in communication with the other opening of the plurality of openings.

The present invention fulfills the above objectives by providing, in a preferred form, an electronic product including a heat dissipating device. The electronic product comprises a casing, at least one heat conducting board, at least one fan unit and a plurality of electronic elements. The casing includes two opposing walls defining a compartment. The at least one heat conducting board is mounted between the two opposing walls in the compartment and divides the compartment into a first chamber and a second chamber. The at least one heat conducting board is located between the first and second chambers. The first chamber includes a plurality of openings. The at least one heat conducting board is solid. The at least one fan unit is mounted in the first chamber. Each said at least one fan unit includes an air inlet and an air outlet. The air inlet is aligned and in communication with an opening of the plurality of openings. The air outlet is aligned and in communication with another opening of the plurality of openings. The plurality of electronic elements is located in the second chamber. At least one of the plurality of electronic elements is mounted upon the at least one heat conducting board. The first chamber and the second chamber are not in communication with each other. The first chamber defines at least one air channel. The at least one heat conducting board includes a plurality of fins located in the at least one air channel. The plurality of fins extends from the at least one heat conducting board towards but spaced from one of the two walls of the casing. The at least one air channel includes a first air channel and a second air channel in communication with the first air channel.

In a form shown, the opening of the plurality of openings is located in an end of the first air channel. The other opening of the plurality of openings is located in an end of the second air channel.

In the form shown, the first and second air channels have an intersection forming a mounting section. The at least one fan unit is mounted in the mounting section.

In the form shown, a further opening of the plurality of openings is located in a top side of the mounting area. An additional opening of the plurality of openings is located in a bottom side of the mounting area.

In the form shown, the fan unit includes another air inlet and another air outlet. The air inlet is aligned and in communication with the further opening. The other air inlet is aligned and in communication with the additional opening. The air outlet is in communication with the opening via the first air channel. The other air outlet is in communication with the other opening via the second air channel.

In the form shown, the plurality of fins is parallel to each other.

The present invention will become clearer in light of the following detailed description of illustrative embodiments of this invention described in connection with the drawings.

BRIEF DESCRIPTION OF THE DRAWINGS

The illustrative embodiments may best be described by reference to the accompanying drawings where.

All figures are drawn for ease of explanation of the basic teachings of the present invention only; the extensions of the figures with respect to number, position, relationship, and dimensions of the parts to form the preferred embodiments will be explained or will be within the skill of the art after the following teachings of the present invention have been read and understood. Further, the exact dimensions and dimensional proportions to conform to specific force, weight, strength, and similar requirements will likewise be within the skill of the art after the following teachings of the present invention have been read and understood.

Where used in the various figures of the drawings, the same numerals designate the same or similar parts. Furthermore, when the terms "first", "second", "third", "fourth", "lower", "upper", "side", "end", and similar terms are used herein, it should be understood that these terms have reference only to the structure shown in the drawings as it would appear to a person viewing the drawings and are utilized only to facilitate describing the invention.

DETAILED DESCRIPTION OF THE INVENTION

Figure 3:
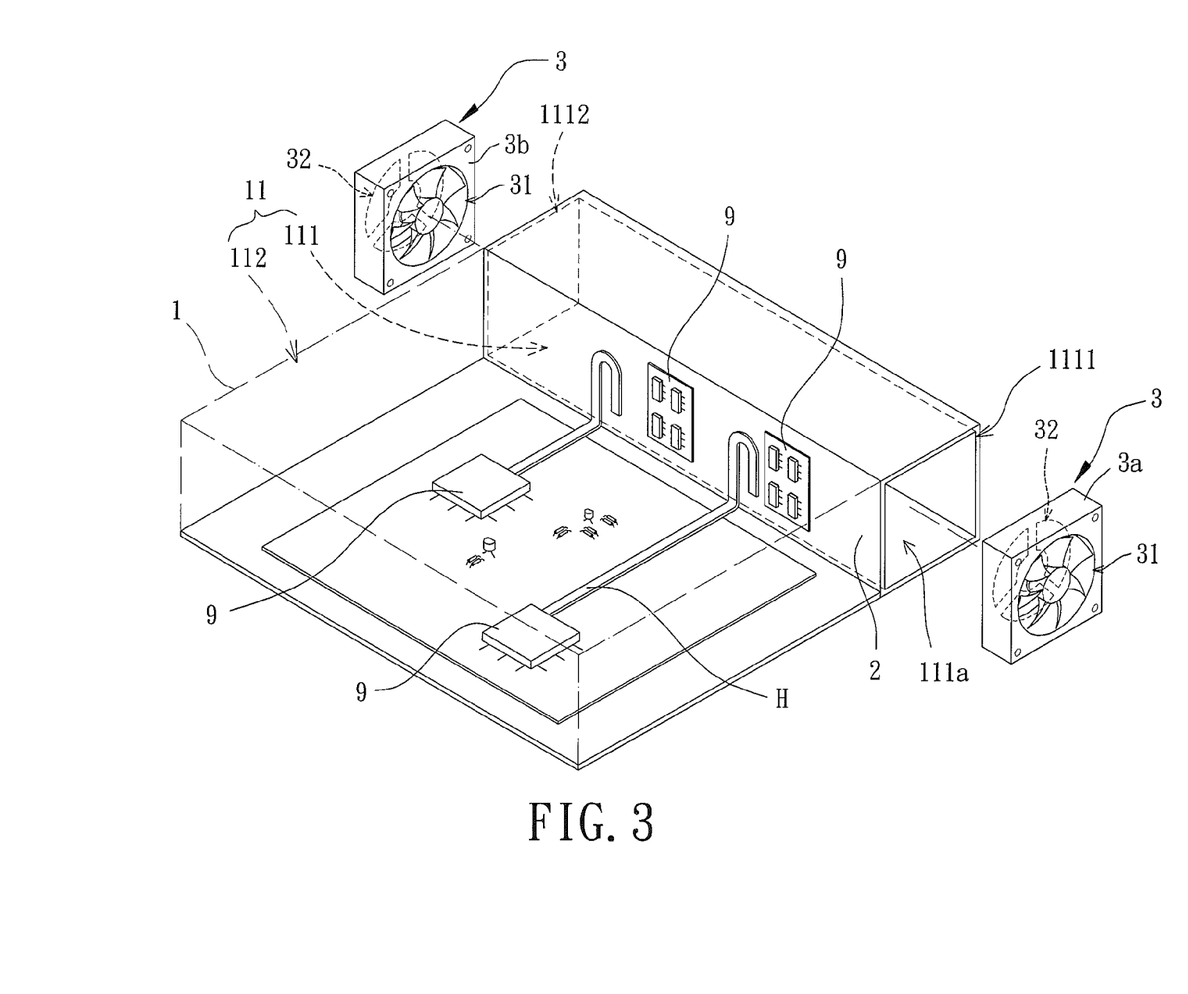
FIG. 3 shows an exploded, perspective view of a heat dissipating device of a first embodiment according to the preferred teachings of the present invention.
Figure 4:
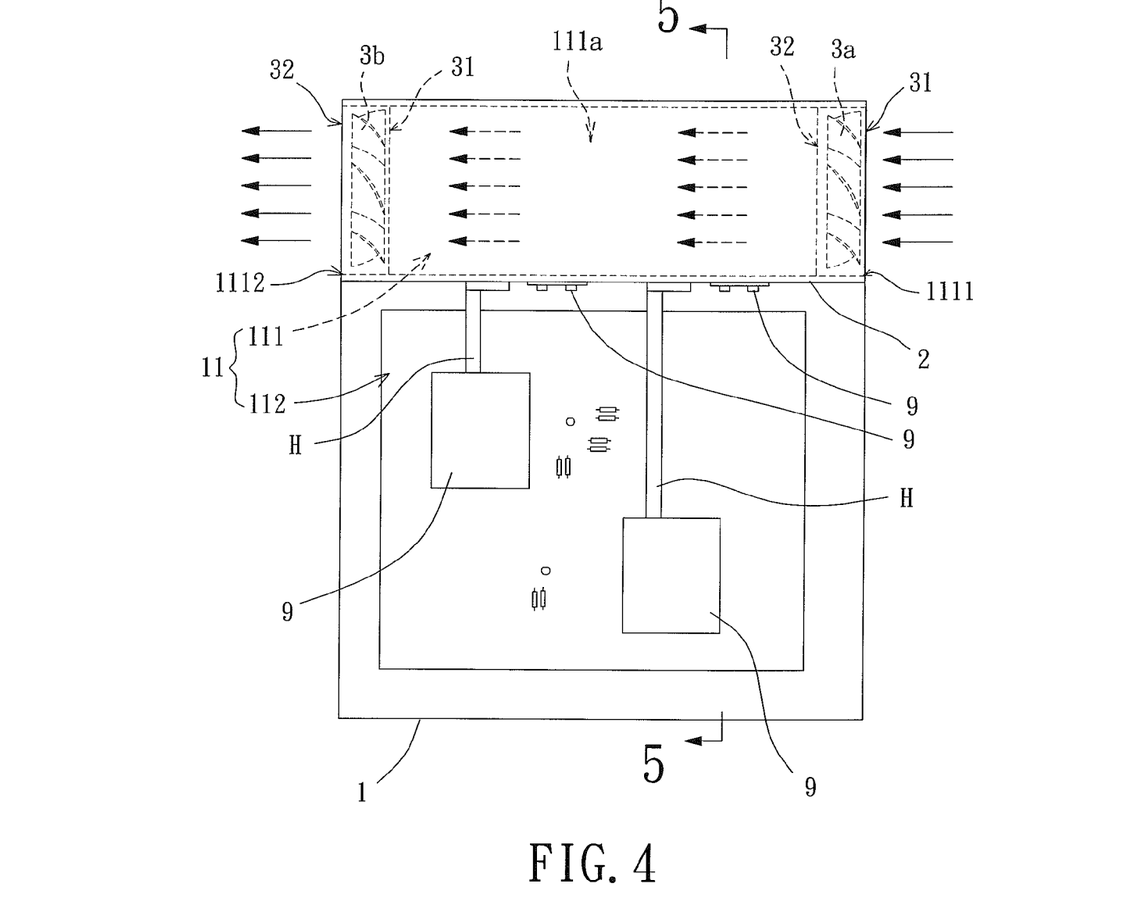
FIG. 4 shows a top view of the heat dissipating device of FIG. 3.
Figure 5:
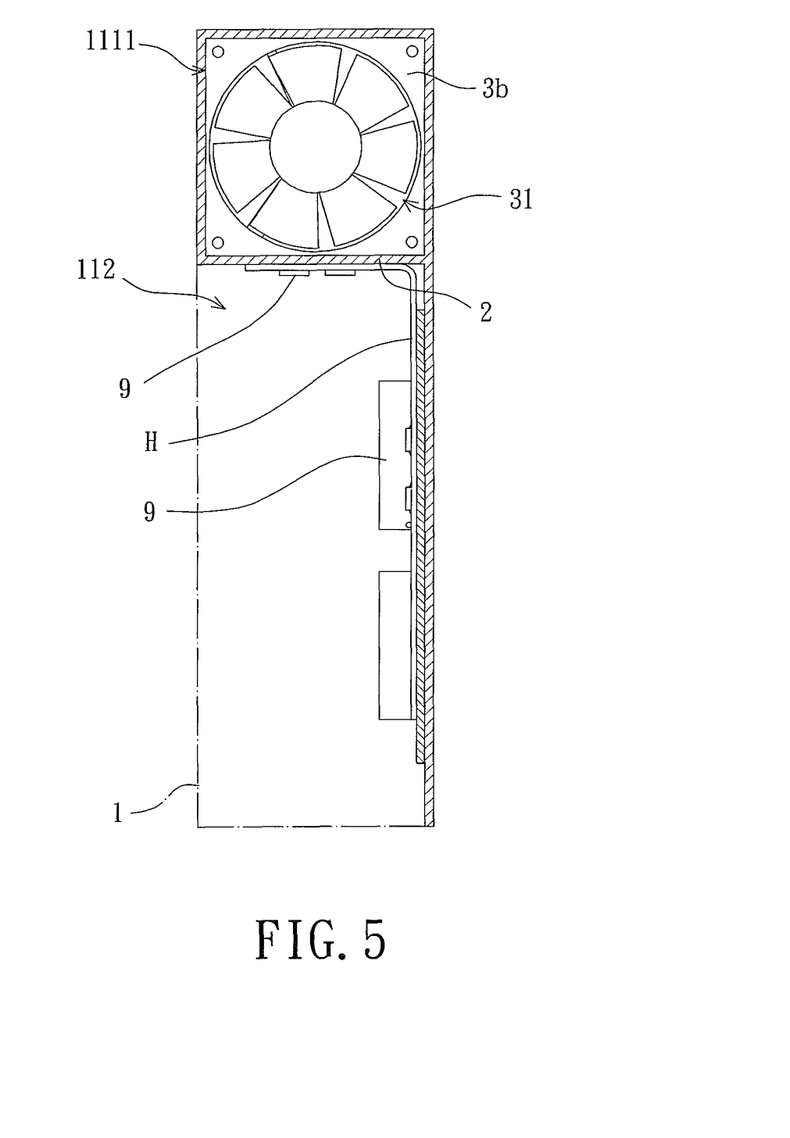
FIG. 5 shows a cross sectional view of the heat dissipating device of FIG. 3 according to section line 5-5 of FIG. 4.

A heat dissipating device of a first embodiment according to the preferred teachings of the present invention is shown in FIGS. 3-5. The heat dissipating device is utilized to dissipate heat generated by a plurality of electronic elements 9 mounted in a casing of an electronic product such as a camera, electronic digital displayer, notebook, satellite navigation device, etc. The heat dissipating device includes a casing 1, at least one heat conducting board 2, and at least one fan unit 3. The casing 1 includes a compartment 11. The at least one heat conducting board 2 is integrally formed or detachably mounted in the compartment 11, dividing the compartment 11 into a first chamber receiving the at least one fan unit 3 and a second chamber receiving the electronic elements 9 such as circuit boards, microprocessors, chips, etc. The at least one heat conducting board 2 is made of metal with excellent heat conduction characteristics, such as aluminum, copper, gold, silver, or an alloy thereof.

In the first embodiment, the heat dissipating device includes only one heat conducting board 2 that separates the compartment 11 into a first chamber 111 and a second chamber 112 between which the heat conducting board 2 is located. The first chamber 111 defines a first air channel 111a. Furthermore, the first chamber 111 includes a plurality of openings. In the first embodiment, the first chamber 111 includes a first opening 1111 in an end of the first air channel 111a and a second opening 1112 in the other end of the first air channel 111a.

The at least one fan unit 3 is mounted in the first chamber 111 and can be of axial-flow type or blower type. In the first embodiment, the heat dissipating device includes first and second fan units 3a and 3b of axial-flow type. The first and second fan units 3a and 3b are respectively mounted in the ends of the first air channel 111a. Each of the first and second fan units 3a and 3b includes an air inlet 31 and an air outlet 32. The air inlet 31 of the first fan unit 3a is aligned and in communication with the first opening 1111. The air outlet 32 of the second fan unit 3b is aligned and in communication with the second opening 1112.

With reference to FIGS. 3-5, in use of the heat dissipating device of the first embodiment according to the teachings of the present invention, the electronic elements 9 of the electronic product is mounted in the second chamber 112 of the casing 1. Some of the electronic elements 9 can be in direct contact with a side of the heat conducting board 2. Other electronic elements 9 can be connected by one or more heat pipes H or the like to the heat conducting board 2.

The electronic elements 9 generate heat during operation, leading to an increase in the temperature in the second chamber 112. The heat conducting board 2 absorbs the heat generated by the electronic elements 9 in direct contact with the side of the heat conducting board 2 and absorbs the heat generated by the other electronic elements 9 via the heat pipes H. Thus, the temperature of the heat conducting board 2 rises. At the same time, the first fan unit 3a draws in ambient air at room temperature via the first opening 1111 and the air inlet 31 of the first fan unit 3a. The air at room temperature is then sent into the first air channel 111a via the air outlet 32 of the first fan unit 3a to proceed with heat exchange with the heat conducting board 2 and turns into hot air, thereby lowering the temperature of the heat conducting board 2. The hot air after heat exchange is drawn into the air inlet 31 of the second fan unit 3b and then expelled to the outside via the air outlet 32 of the second fan unit 3b. Continuous airflow can be created in the first air channel 111a for dissipating heat of the heat conducting board 2.

According to the teachings of the present invention, by utilizing the side of the heat conducting board 2 to absorb the heat generated by the electronic elements 9 in the second chamber 112 and by creating airflow in the first chamber 111 at the other side of the heat conducting board 2 with the fan unit 3, the temperature of the second chamber 112 and the electronic elements 9 is lowered. Furthermore, since the first and second chambers 111 and 112 are independent from each other, the first chamber 111 can be in communication with or not in communication with the second chamber 112. In the first embodiment, the first chamber 111 is not in communication with the second chamber 112. Thus, the moisture, dust, or the like contained in the ambient air and drawn by the fan unit 3 into the first chamber 111 together with the air will not enter the second chamber 112. Thus, the electronic elements 9 will not be moistened or contaminated by the moisture, dust, or the like, avoiding short circuit of the electronic elements 9 and prolonging the service life and enhancing stability of the electronic product.

Furthermore, since the electronic elements 9 can be either directly bonded to or indirectly coupled by heat pipes H to the heat conducting board 2, the heat generated by the electronic elements 9 can be more directly and rapidly transferred to the heat conducting board 2 for heat dissipation purposes. The overall heat dissipating effect of the heat dissipating device according to the teachings of the present invention is, thus, enhanced.

Figure 6:
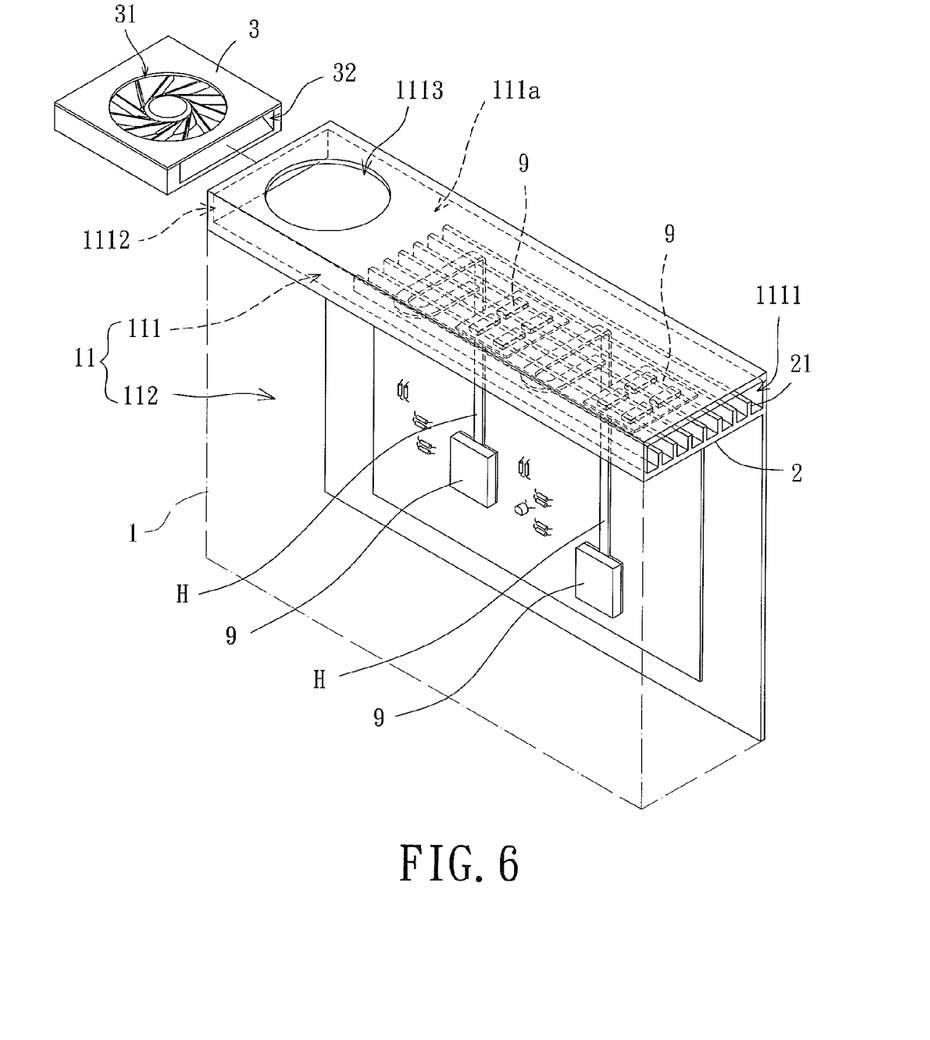
FIG. 6 shows an exploded, perspective view of a heat dissipating device of a second embodiment according to the preferred teachings of the present invention.
Figure 7:
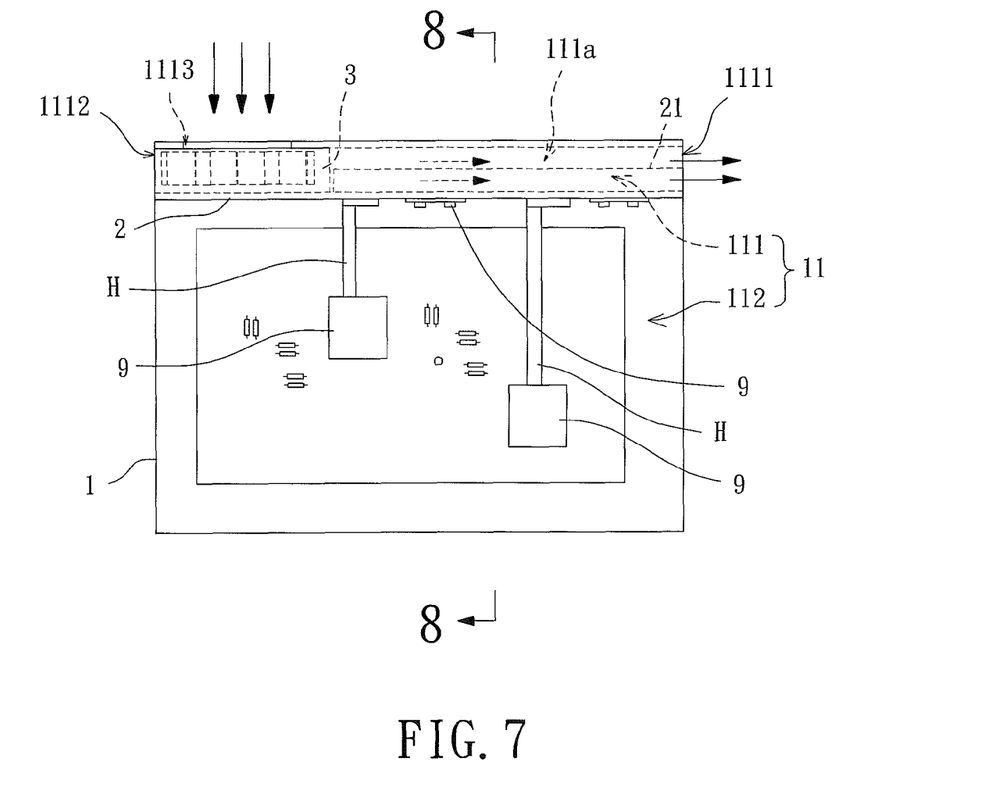
FIG. 7 shows a top view of the heat dissipating device of FIG. 6.
Figure 8:
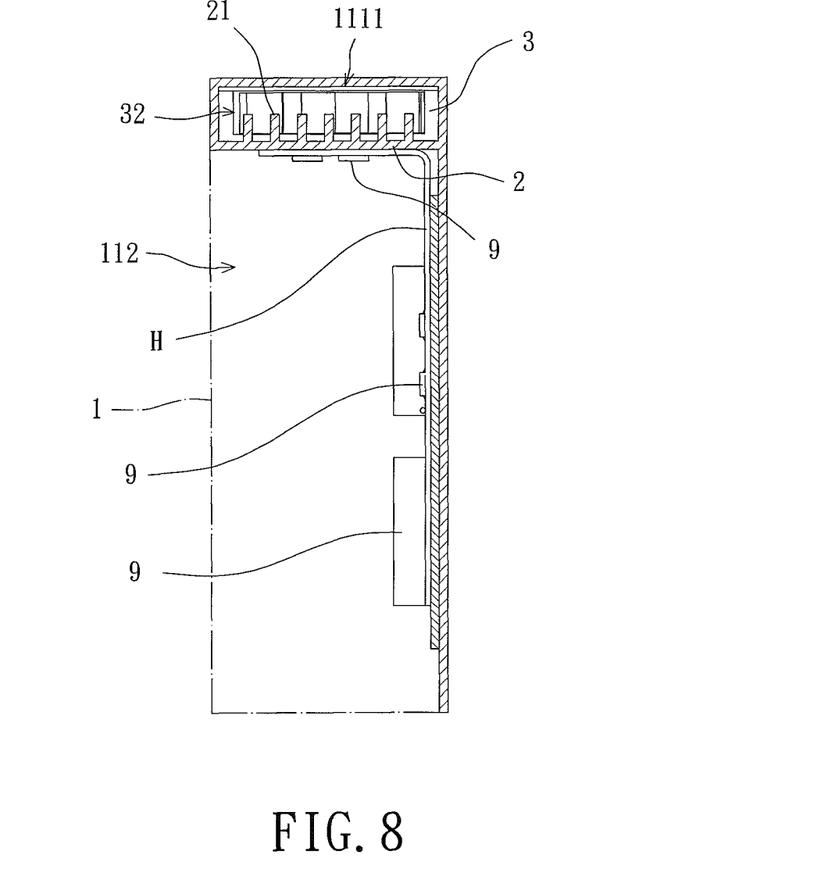
FIG. 8 shows a cross sectional view of the heat dissipating device of FIG. 6 according to section line 8-8 of FIG. 7.

FIGS. 6-8 show a heat dissipating device of a second embodiment according to the preferred teachings of the present invention. Compared to the first embodiment, the first chamber 111 of the heat dissipating device of the second embodiment includes first, second, and third openings 1111, 1112, and 1113. The first opening 1111 is in an end of the first air channel 111a, the second opening 1112 is in the other end of the first air channel 111a, and the third opening 1113 is in a side (the top side in the preferred form shown) of the first chamber 111 and in communication with the first air channel 111a. Furthermore, the fan unit 3 is mounted into the first air channel 111a via the second opening 1112.

With reference to FIGS. 6-8, a plurality of fins 21 is mounted to a side of the heat conducting board 2. The fins 21 are parallel to each other and located in the first air channel 111a. Furthermore, each fin 21 extends from the first opening 1111 towards but spaced from the second opening 1112. The fan unit 3 is of blower type and includes an air inlet 31 and an air outlet 32. The air inlet 31 is aligned and in communication with the third opening 1113. The air outlet 32 is aligned and in communication with the first opening 1111.

In this embodiment, by utilizing the side of the heat conducting board 2 to absorb the heat generated by the electronic elements 9 in the second chamber 112 and by drawing air at room temperature into the first air channel 111a with the fan unit 3 to dissipate heat from the heat conducting board 2 and the fins 21, the temperature of the heat conducting board 2 is lowered, because the heat accumulated in the heat conducting board 2 and the fins 21 is carried away by the air. After heat exchange, the hot air is expelled to the outside via the first air opening 1111. Thus, the temperature of the second chamber 112 and the electronic elements 9 in the second chamber 112 can be effectively lowered while prolonging the service life and enhancing stability of the electronic product by preventing the moisture, dust, or the like from entering the second chamber 112.

Figure 9:
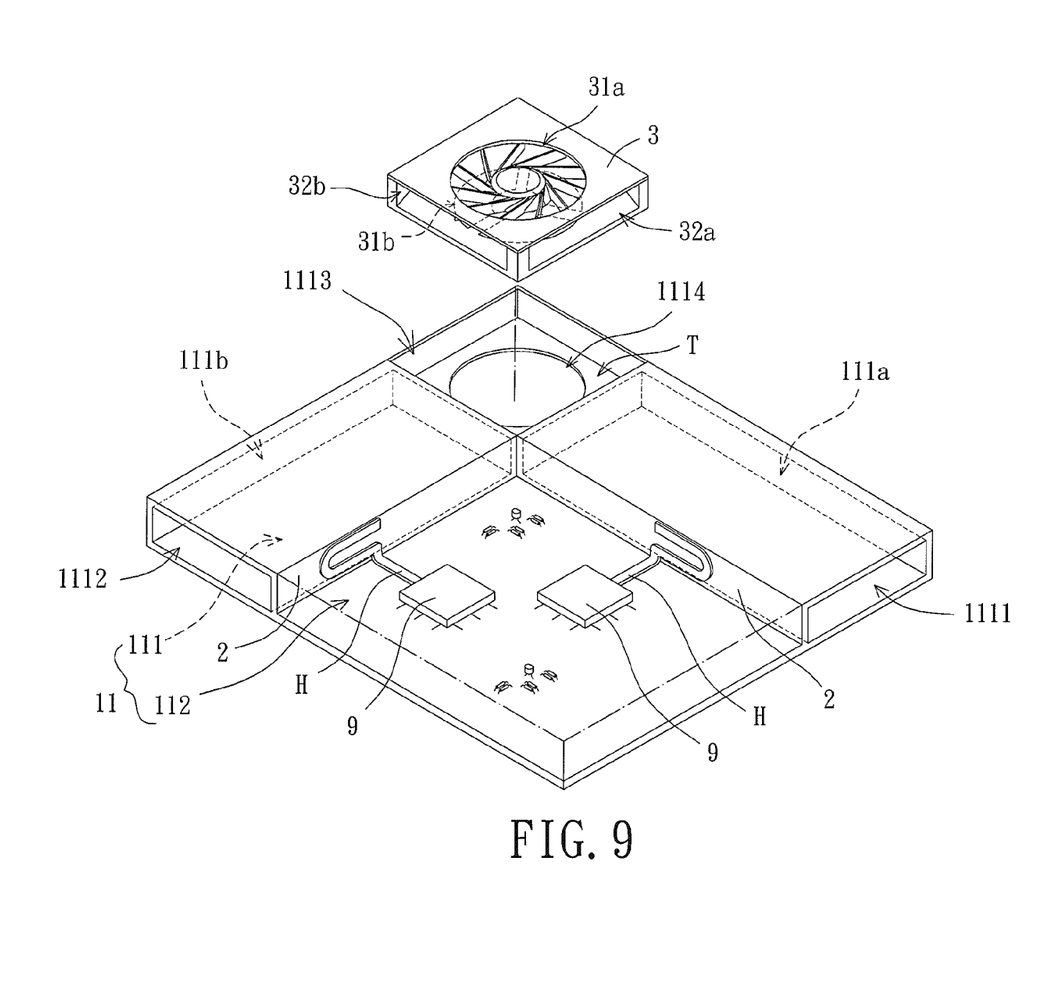
FIG. 9 shows an exploded, perspective view of a heat dissipating device of a third embodiment according to the preferred teachings of the present invention.
Figure 10:
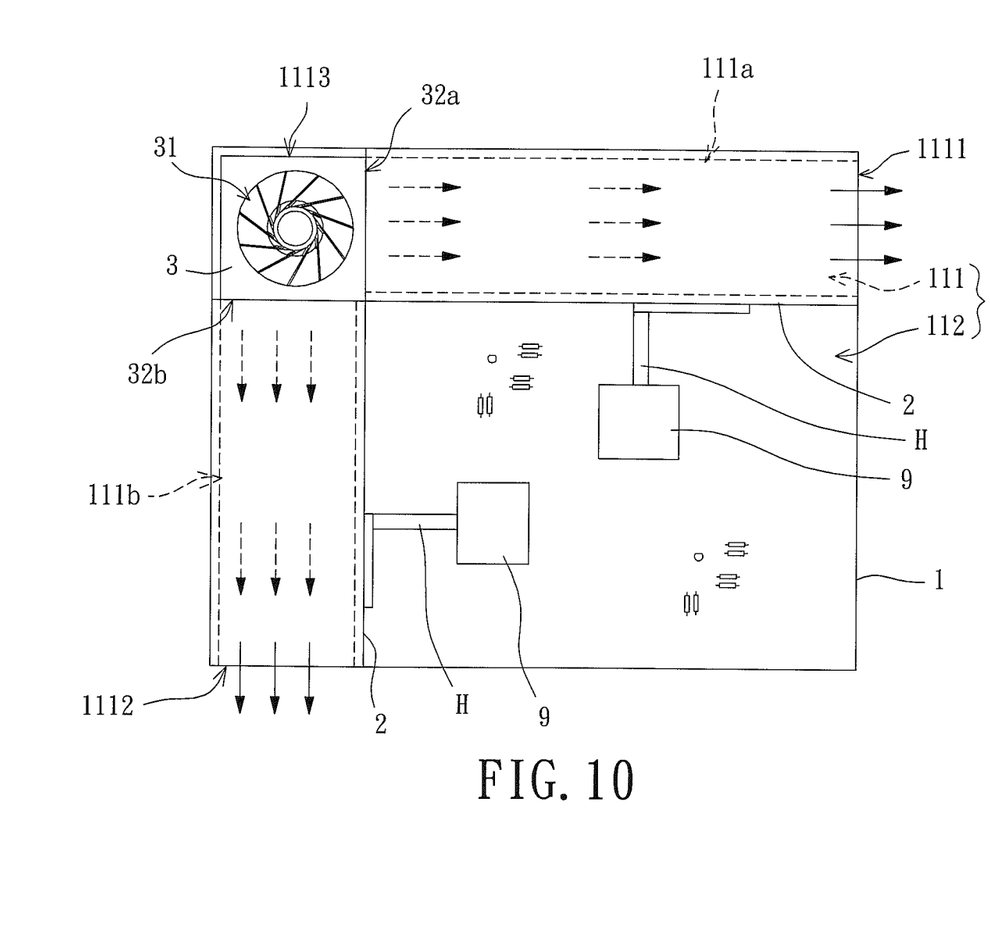
FIG. 10 shows a top view of the heat dissipating device of FIG. 9.

FIGS. 9 and 10 show a heat dissipating device of a third embodiment according to the preferred teachings of the present invention. Compared to the second embodiment, the heat dissipating device of the third embodiment includes two heat conducting boards 2 to separate the compartment 11 into a first chamber 111 and a second chamber 112. The first chamber 111 is substantially L-shaped in cross section and includes a first air channel 111a and a second air channel 111b in communication with the first air channel 111a. An intersection of the first and second air channels 111a and 111b forms a mounting area T in which the fan unit 3 is mounted. The first chamber 111 includes first, second, third, and fourth openings 1111, 1112, 1113, and 1114. The first opening 1111 is located in an end of the first air channel 111a, and the second opening 1112 is located in an end of the second air channel 111b. The third opening 1113 is located in a top side of the mounting area T, and the fourth opening 1114 is located in a bottom side of the mounting area T. The fan unit 3 can be mounted into the mounting area T via the third opening 1113.

The fan unit 3 includes a first air inlet 31a, a second air inlet 31b, a first air outlet 32a, and a second air outlet 32b. When the fan unit 3 is mounted in the mounting area T, the first air inlet 31a is aligned and in communication with the third opening 1113, the second air inlet 31b is aligned and in communication with the fourth opening 1114, the first air outlet 32a is in communication with the first opening 1111 via first air channel 111a, and the second air outlet 32b is in communication with the second opening 1112 via the second air channel 111b.

In this embodiment, by utilizing the heat conducting boards 2 to absorb the heat generated by the electronic elements 9 in the second chamber 112 and by drawing air at room temperature into the first and air channels 111a and 111b with the fan unit 3 via the first and second air inlets 31a and 31b to dissipate heat from the heat conducting boards 2, the temperature of the heat conducting boards 2 is lowered, because the heat accumulated in the heat conducting boards 2 is carried away by the air. After heat exchange, the hot air is expelled to the outside via the first and second openings 1111 and 1112. Thus, the temperature of the second chamber 112 and the electronic elements 9 in the second chamber 112 can be effectively lowered while prolonging the service life and enhancing stability of the electronic product by preventing the moisture, dust, or the like from entering the second chamber 112.

Furthermore, the heat exchange area between the heat conducting boards 2 and the second chamber 112 as well as the electronic elements 9 is largely increased while the fan unit 3 drives air to flow through the first and second air channels 111a and 111b for dissipating heat from the heat conducting boards 2, enhancing the overall heat dissipating efficiency and maintaining a stable operating temperature for the electronic elements 9.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A heat dissipating device comprising:
    a casing including two opposing walls defining a compartment;
    at least one heat conducting board mounted between the two opposing walls in the compartment and dividing the compartment into a first chamber and a second chamber, with said at least one heat conducting board located between the first and second chambers, with the first chamber including a plurality of openings, with the at least one heat conducting board being solid;
    at least one fan unit mounted in the first chamber, with each said at least one fan unit including an air inlet and an air outlet, with said air inlet aligned and in communication with an opening of the plurality of openings, with said air outlet aligned and in communication with another opening of the plurality of openings; and a plurality of electronic elements located in the second chamber, with at least one of the plurality of electronic elements mounted upon the at least one heat conducting board, with the first chamber and the second chamber not being in communication with each other, with the first chamber defining at least one air channel, with said at least one heat conducting board including a plurality of fins, with the plurality of fins located in the at least one air channel, and with the plurality of fins extending from the at least one heat conducting board towards but spaced from one of the two walls of the casing, with the at least one air channel being in the form of a single air channel including first and second ends respectively in communication with the opening and the other opening of the plurality of openings, with said at least one fan unit including first and second fan units, with the air inlet of the first fan unit aligned and in communication with the opening of the plurality of openings, and with the air outlet of the second fan unit aligned and in communication with the other opening of the plurality of openings.

2. A heat dissipating device comprising:

a casing including two opposing walls defining a compartment;

at least one heat conducting board mounted between the two opposing walls in the compartment and dividing the compartment into a first chamber and a second chamber with said at least one heat conducting board located between the first and second chambers, with the first chamber including a plurality of openings, with the at least one heat conducting board being solid;

at least one fan unit mounted in the first chamber, with each said at least one fan unit including an air inlet and an air outlet, with said air inlet aligned and in communication with an opening of the plurality of openings, with said air outlet aligned and in communication with another opening of the plurality of openings; and a plurality of electronic elements located in the second chamber, with at least one of the plurality of electronic elements mounted upon the at least one heat conducting board, with the first chamber and the second chamber not being in communication with each other, with the first chamber defining at least one air channel, with said at least one heat conducting board including a plurality of fins, with the plurality of fins located in the at least one air channel, and with the plurality of fins extending from the at least one heat conducting board towards but spaced from one of the two walls of the casing, with the at least one air channel including a first air channel and a second air channel in communication with the first air channel.

3. The electronic product including the heat dissipating device as claimed in claim 2, with the opening of the plurality of openings located in an end of the first air channel, with the other opening of the plurality of openings located in an end of the second air channel.

4. The electronic product including the heat dissipating device as claimed in claim 3, with the first and second air channels having an intersection forming a mounting section, and with the at least one fan unit mounted in the mounting section.

5. The electronic product including the heat dissipating device as claimed in claim 4, with a further opening of the plurality of openings located in a top side of the mounting area, and with an additional opening of the plurality of openings located in a bottom side of the mounting area.

6. The electronic product including the heat dissipating device as claimed in claim 5, with the fan unit including another air inlet and another air outlet, with the air inlet aligned and in communication with the further opening, with the other air inlet aligned and in communication with the additional opening, with the air outlet in communication with the opening via the first air channel, and with the other air outlet in communication with the other opening via the second air channel.

7. The electronic product including the heat dissipating device as claimed in claim 2, with the plurality of fins parallel to each other.

\* \* \* \* \*